United States Patent [19]

Theus et al.

[11] Patent Number: 5,260,614
[45] Date of Patent: Nov. 9, 1993

[54] HALL SENSOR WITH AUTOMATIC COMPENSATION

[75] Inventors: Ulrich Theus, Gundelfingen; Mario Motz, Endingen; Juergen Niendorf, Frankfurt an der Oder, all of Fed. Rep. of Germany

[73] Assignee: Deutsche ITT Industries GmbH, Freiburg, Fed. Rep. of Germany

[21] Appl. No.: 918,484

[22] Filed: Jul. 22, 1992

[30] Foreign Application Priority Data

Jul. 31, 1991 [EP] European Pat. Off. ............ 91112840

[51] Int. Cl.$^5$ ...................... G05F 1/32; H03K 17/90
[52] U.S. Cl. .................................. 307/491; 307/309; 307/278; 307/296.6
[58] Field of Search ............. 307/309, 278, 491, 296.6

[56] References Cited

U.S. PATENT DOCUMENTS

| | | | |
|---|---|---|---|
| 4,705,964 | 11/1987 | Higgs | 307/278 |
| 4,833,406 | 5/1989 | Foster | 307/309 |
| 4,857,842 | 8/1989 | Sturman et al. | 307/309 |
| 4,908,527 | 3/1990 | Van Antwerp | 307/491 |
| 4,922,123 | 5/1990 | Rozman | 307/309 |
| 5,055,768 | 10/1991 | Plagens | 307/309 |
| 5,068,606 | 11/1991 | Karwate et al. | 307/309 |
| 5,084,674 | 1/1992 | Laehmann et al. | 307/309 |

FOREIGN PATENT DOCUMENTS 0285016 10/1988 European Pat. Off. .

OTHER PUBLICATIONS

U. Tietze, et al., "Multipliers with Logarithmic Function Networks," *Advanced Electronic Circuits*, Chapter 1.8.2, pp. 36–37, Springer-Verlag, 1978.

Klaas Bult, et al., "A Class of Analog CMOS Circuits Based on the Square-Law Characteristic of an MOS Transistor in Saturation," *IEEE Journal of Solid-State Circuits*, vol. SC-22, No. 3, Jun. 1987, pp. 357–365.

*Primary Examiner*—John S. Heyman
*Assistant Examiner*—My Trong
*Attorney, Agent, or Firm*—Thomas L. Peterson

[57] ABSTRACT

A circuit and method automatically compensate a monolithic integrated Hall sensor having a Hall element therein, wherein a device for generating operating currents is technologically and thermally tightly coupled with the Hall element. The production-induced and temperature-induced variations in the sensitivity of the Hall element are compensated for by a defined control of the supply current and the offset current. For the control, the thermal and technological parameters of the Hall element semiconductor region or equivalent regions in corresponding circuits are used. For this purpose, at least two current sources are provided which generate at least two auxiliary currents with different temperature dependences. By means of adding/subtracting devices, resultant currents with other temperature dependences are formed from the auxiliary currents by summation/subtraction and different weighting.

20 Claims, 3 Drawing Sheets

HALL SENSOR WITH AUTOMATIC COMPENSATION

BACKGROUND OF THE INVENTION

1. Field of the Invention

The present invention relates to a compensated, monolithic integrated Hall sensor comprising an integrated power supply device for operating currents. The invention further relates to a method for automatically compensating a Hall sensor for the production-induced sensitivity and the temperature dependence of the Hall element with and without a hysteresis switching device.

2. Description of the Related Art

Monolithic integrated Hall sensors are available commercially. In addition to being used to measure magnetic fields, monolithic integrated Hall sensors are increasingly employed where non-contacting switching is to be effected, such as, for example, in the field of rotational speed measurements in the gearing or tachometer area of automobiles. In such switch applications, the direction and magnitude of an alternating or unipolar magnetic field is determined by means of the Hall voltage, and when a threshold is exceeded, a count pulse is released. The electronic switch, which is represented, for example, by the open collector of a transistor, is, in most cases, part of the integrated circuit and, hence, part of the Hall sensor. For switch applications, Hall sensors generally include amplifying sensing elements or buffer amplifiers, Schmitt-trigger stages having hysteresis, and current-supply and/or voltage-supply devices.

A disadvantage of the known Hall sensors is that the compensation of the production variations in sensitivity and of the temperature dependence of the Hall element must be accomplished by individual adjustment steps during chip fabrication.

It is, therefore, the object of the invention as described and claimed herein to provide a circuit for a compensated Hall sensor, and to further provide a method underlying this circuit which permits automatic compensation of the technology-induced and temperature-induced variations in sensitivity without individual adjustment steps.

SUMMARY OF THE INVENTION

An advantage offered by the invention lies essentially in the elimination of the need for individual adjustments, so that simpler semiconductor-device fabrication techniques can be used. In addition, the chip area required is reduced by the area of the otherwise required adjusting contacts, an area which is not negligible. The automatic compensation is applicable both to linear Hall sensors for measurement applications and to Hall sensors with a switching function, including, for example, a hysteresis switching function. It is also possible to preset the temperature dependence of the Hall sensors within certain limits. Since the automatic compensation is only controlled by the tracking of technological manufacturing parameters on the respective semiconductor chips, non-linear effects of these parameters are also largely compensated for.

One of the fundamental ideas of the invention is that the operating currents for the Hall element are generated by a power supply device on the semiconductor chip, i.e., a device thermally and technologically coupled with the Hall element semiconductor region. The Hall voltage (uh) is dependent on the technological parameters, the absolute temperature (T), and the reference temperature (To) of the Hall element semiconductor region as follows:

$$uh(T) = \mu_H(T) \times R(T) \times iv(T) \times B, \quad (1)$$

where:

$\mu_H$ = temperature-dependent and material-dependent Hall mobility $$\mu_H(T) = \mu(To) \times 1/(1 + a \times \Delta T) \quad (1.1)$$

$\Delta T = T - To$ = reference-temperature difference
$R(T)$ = ohmic resistance of the Hall element $$R(T) = R(To) \times (1 + a \times \Delta T)$$

$iv(T)$ = supply current for the Hall element
$B$ = magnetic induction
$a$ = temperature coefficient of the sheet resistivity ($r'$) of the Hall element semiconductor region at the reference temperature.

The temperature and process-technology dependence of the Hall voltage is obtained by substituting the individual dependencies into equation (1). The technology-dependent factor $(1 + a \times \Delta T)$ cancels out, so that only the temperature dependence of the supply current $iv(T)$ will enter into the Hall voltage $uh(T)$ if the magnetic induction B is temperature-independent:

$$uh(T) = \text{proportionality factor} \times iv(T) \quad (2)$$

Equation (2) shows that the temperature dependence of the Hall voltage is tightly coupled to that of the supply current. It is, of course, especially interesting that the Hall voltage will exhibit no temperature dependence if the temperature dependence of the supply current is adjusted to zero.

If an offset voltage (uj) is superimposed on the Hall voltage uh by means of an offset current (j) at the sense inputs of the Hall element, the value of the offset voltage is:

$$uj(T) = j(T) \times rh(T), \quad (3)$$

where
$rh$ = equivalent resistance of the Hall element.
Thus:
$$uj(T) = j(T) \times rh(To) \times (1 + a \times \Delta T) \quad (4)$$

To zero the temperature dependence of the offset voltage at the reference temperature To, therefore, the following condition must be fulfilled for the offset current $iv(T)$:

$$j(T) = j(To) \times 1/(1 + a \times \Delta T) \quad (5)$$

For the tracking of the temperature dependence of the Hall voltage and the offset voltage, particularly during zero adjustment, the following condition, which follows from the equations (2) and (5), must be fulfilled:

$$\Delta iv(T)/\Delta j(T) = 1 + a \times \Delta T. \quad (6)$$

Equation (6) combines the ratio of the temperature dependences of the operating currents of the Hall element with the temperature dependence of the sheet resistivity ($r'$) of the Hall element semiconductor region, which is defined by the factor $(1 + a \times \Delta T)$. Thus, according to equation (6), the absolute value of the temperature dependences of the operating currents is freely pre-settable for either of the operating currents iv and j. Since equation (6) applies for any reference temperature To and for the entire operating-temperature range, it represents an excellent evaluation criterion for comparing the temperature compensation of different circuit variants.

The invention further makes use of the recognition that, by forming sums or differences of currents with different temperature dependences, resultant currents with other temperature dependences can be formed. The greater the different temperature dependences, the better the repeatability of this method. According to the invention, a power supply device for at least two auxiliary currents with different temperature characteristics are integrated on the Hall sensor. The respective temperature characteristic is assumed to be approximately linear, the relative slope being determined at a reference temperature To, for example, 333 degrees kelvin. The relative slope is advantageously given as a positive or negative ppm (parts per million) value. By adding or subtracting the respective ppm values, one can easily determine the associated portions or weighting factors of the auxiliary currents at the respective reference temperature To, which result in the new current with the desired temperature coefficient at the reference temperature To. How good this temperature tuning is over the entire temperature range cannot be determined without knowing the exact temperature characteristics outside the reference temperature To. There the temperature approximation can be more or less good.

The following simple example, based on two auxiliary currents I1, I2 of equal magnitude, illustrates the determination of the weighting factors. I1 has a temperature dependence of +5000 ppm, and I2 has a temperature dependence of −2000 ppm. By summation of the weighting factor 2.5 for I2, a sum current is obtained whose temperature dependence is 0 ppm, i.e., which exhibits no temperature dependence at least at the reference temperature. I1+2.5×I2 gives in simple ppm notation:

$$5000 \text{ ppm} + (-2.5 \times 2000 \text{ ppm}) = 0 \text{ ppm}.$$

Subtraction with the weighting factor 2 for I2 gives a differential current I1−2×I2 whose temperature dependence at the reference point has the following value in simple ppm notation:

$$5000 \text{ ppm} - (-2 \times 2000 \text{ ppm}) = 9000 \text{ ppm}.$$

For the currents to be sufficiently reproducible and the simple calculation of the weighting factors via the ppm representation to be permissible, the differential current should be of the order of the single currents I1 or I2. The generation of currents with different temperature dependences will be explained with reference to the embodiments.

From equation (6), advantageous implementations for automatically compensating the hysteresis switching sensitivity result, depending on which dependences the supply current iv(T) has. For the following considerations, it is assumed that the sheet resistivity r' of the Hall element semiconductor region enters as a common factor into the magnitudes of the supply current iv and the offset current j.

First case: If iv(T) is constant and temperature-independent, then uh(T) is also constant, but the temperature dependence of the offset current j(T) must obey the following condition:

$$j(T) = j(To)/(1 + a \times \Delta T). \tag{7}$$

FIG. 1, discussed in more detail below, illustrates the preferred embodiment for this.

Second case: Another advantageous mode of operation is obtained if the Hall element is supplied directly with the supply voltage VDD because the supply current iv and, thus, the Hall sensitivity, are then the greatest. In that case, the respective value of the supply voltage VDD and the usual temperature dependence VDD(T) of the supply voltage, as well as the temperature dependence of the Hall element semiconductor region, enter into the magnitude of the supply current iv. The supply current iv(T) is thus determined by the following equation, in which VDDo represents a fixed supply voltage reference value or normalized value:

$$iv(T, VDD) = iv(To) \times (VDD/VDDo)/(1 + a \times \Delta T). \tag{8}$$

From equation (6) it follows that the offset current j(T) must also be dependent on the supply voltage VDD. The temperature dependence of the Hall element semiconductor region, however, must enter into the magnitude of the offset current with the factor $1/(1 + a \times \Delta T)^2$. Thus, the following condition equation is obtained for the offset current J(T):

$$j(T, VDD) = j(To) \times (VDD/VDDo)/(1 + a \times \Delta T)^2. \tag{9}$$

The desired temperature dependence is achieved by multiplying a first current component ik1 by a second current component ik2, with ik1 being proportional to $1/(1 + a \times \Delta T)$, and ik2 being proportional to $(VDD/VDDo)/1 + a \times \Delta T)$. Thus, $ik1 \times ik2_2 = j$ becomes proportional to $(VDD/VDDo)/(1 + a \times \Delta T)^2$, as desired. For the current multiplication, a third current component ik3 with a zero temperature coefficient is needed as a reference current. A preferred embodiment for the second case is shown in FIG. 2, discussed in detail below.

Third case: In a further advantageous mode of operation, the Hall element is supplied with a temperature-stabilized Hall element supply voltage (V) rather than the unregulated supply voltage VDD. Then, instead of multiplying two different current components ik1, ik2, it is only necessary to square the current component ik1. The reference current ik3 with a zero temperature coefficient is still needed. The offset current j(T) is given by:

$$j(T) = j(To)/(1 + a \times \Delta T)^2. \tag{10}$$

A further simplification is possible if $a \times \Delta T$ becomes much less than 1 because the quadratic factor $1/(1 + a \times \Delta T)^2$ can be replaced approximately by the factor $1/(1 + 2 \times a \times \Delta T)$, which is again realizable via an addition or subtraction of currents with different temperature characteristics. The same applies for the quadratic factor in equations (8) and (9). A preferred embodiment for this third case is shown in FIG. 3, discussed in detail below.

BRIEF DESCRIPTION OF THE DRAWINGS

The invention and further advantages will now be explained in more detail, with reference to the accompanying drawing, in which.

DETAILED DESCRIPTION OF THE PREFERRED EMBODIMENTS

Figure 1:
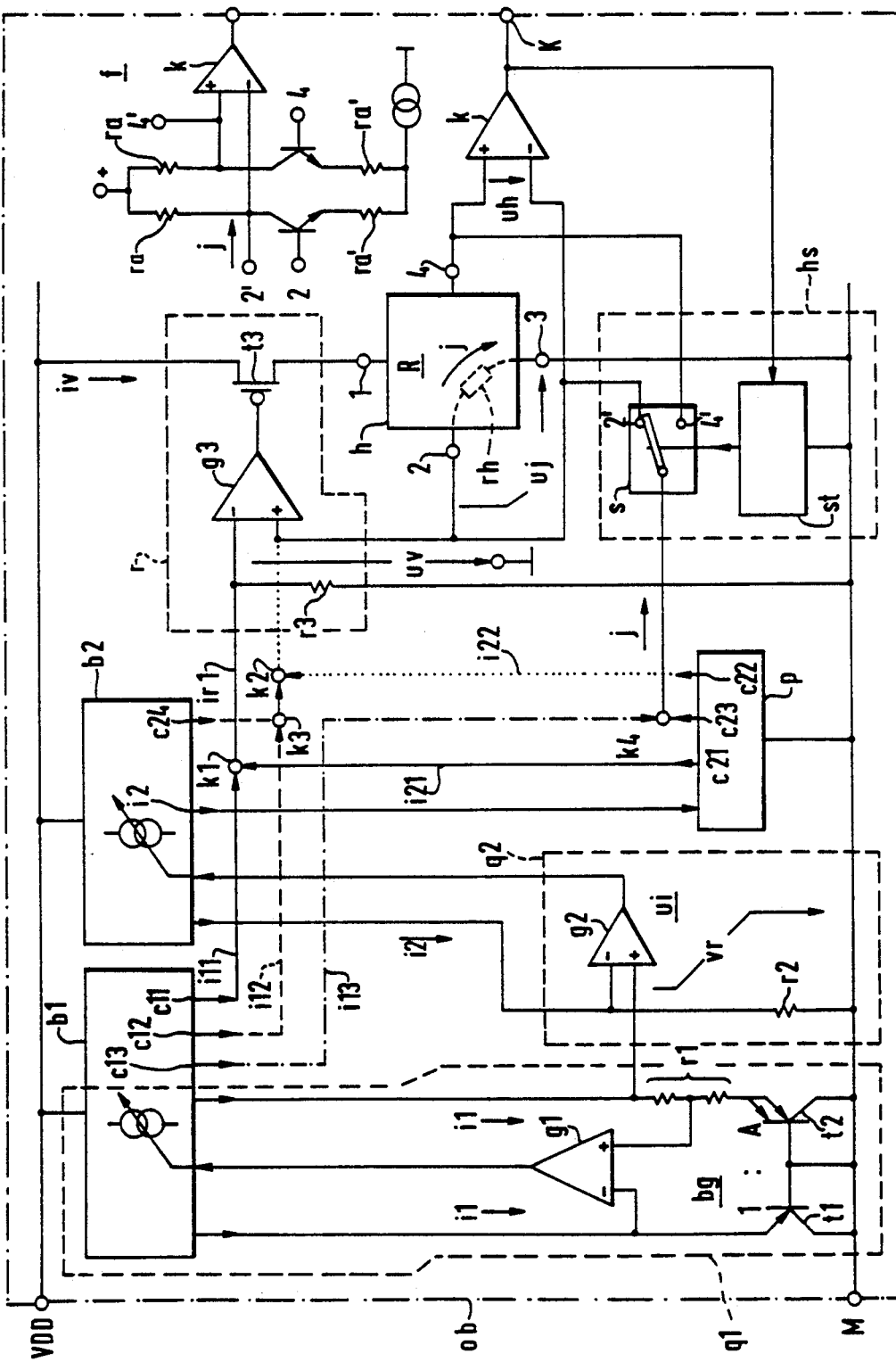
FIG. 1 is a block diagram of a first preferred embodiment of a Hall sensor with a hysteresis switching device.

FIG. 1 schematically illustrates a first embodiment of a Hall sensor with a hysteresis switching device. It is a self-compensating Hall sensor which is realized using monolithic integrated circuit techniques and in which all power supply devices for the operating currents are integrated on the chip surface ob. The Hall sensor is designed as a three-lead device and only requires terminals for a supply voltage vDD, a ground terminal M, and a low-impedance output terminal K, which provides the output signal of the Hall sensor.

The embodiment of FIG. 1 includes a hysteresis switching device hs which superimposes an offset voltage uj on the Hall voltage uh to cause defined switching of a comparator k connected to the sense inputs 2 and 4 of the Hall element h. The Hall element h is depicted in a simplified representation, since, as a rule, use is made of two parallel-connected Hall elements spaced by 90° for crystal lattice reasons and having an orientation of 45° with respect to the crystal edge.

To permit the Hall sensor to be used as a periodic switch, the offset voltage uj is switched alternately, the switching being effected by the respective state of the comparator k. To this end, the output of the comparator k is connected to a controller st which determines the respective position of an electronic changeover switch s. Depending on the position of the latter, an offset current j is fed into the Hall element h either through the sense input z or through the sense input 4. This offset current j produces the offset voltage uj across the Hall element equivalent resistance rh between the respective sense terminal 2 or 4 and the ground terminal 3.

For quantitative magnetic-field measurements, the hysteresis switching device hs is not necessary. The comparator k is then replaced by a high-impedance linear sensing device which senses the Hall voltage uh and makes it available as a corresponding voltage value at the low-impedance output terminal K.

The superposition of the offset current j need not necessarily take place directly at the Hall element h but may be effected by a decoupled superposing device f, which is shown as an additional circuit detail in FIG. 1. The decoupling network consists of two parallel-connected transistor stages whose gains are set to the same value by means of equal-value auxiliary resistors ra, ra'. The comparator k is connected to the collector terminals 2', 4', where the offset current j is injected. The base terminals 2, 4 and the collector terminals 2', 4' are connected to the likewise designated terminals 4' of the Hall element h and the electronic changeover switch s, respectively. The decoupled superposing device f described is only exemplary. Other embodiments, including embodiments using field-effect transistors, can be readily implemented by those skilled in the art. The offset current j, or a part thereof, may also be superimposed on the Hall voltage uh symmetrically, without the hysteresis switching device hs.

It is explicitly pointed out here that the embodiments are suitable for monolithic integration in both bipolar and field-effect-transistor technology or in hybrid technology. The adaptation of the individual circuit parameters and the most appropriate design of the individual circuit modules are familiar to those skilled in the art.

The operating currents for the Hall element h, namely a supply current iv and the offset current j, are generated by a power supply device which is integrated on the chip surface ob. This allows the operating currents to be technologically and thermally coupled to the production variations of the Hall elements semiconductor region and its respective operating temperature T. To this end, the power supply device contains a first current source q1 for a first auxiliary current i1 with a first temperature dependence, and a second current source q2 for a second auxiliary current i2 with a second temperature dependence. The first and second current sources q1 and q2 include at least one first resistor r1 and at least one second resistor r2, respectively, whose semiconductor regions are technologically equivalent to the semiconductor region of the Hall element h. The first current source q1 includes, for example, a band-gap circuit bg with a transistor pair t1, t2 whose emitter-area ratio has the value A (e.g., A=14). The first resistor r1 for determining the first auxiliary current i1 consists, for example, of a 24-kilohm resistor in series with a 207-kilohm resistor.

As is well known, the operation of the band-gap circuit consists in the fact that the equal emitter currents of the transistor pair t1, t2 are regulated by a regulating circuit at such a value that the base-emitter voltage difference, which is caused by the emitter-area ratio A, is equal to value to the voltage drop across that of the resistors of r1 which is involved in the voltage comparison. This voltage comparison is performed by a first control amplifier g1, whose inputs are connected to the emitter of the first transistor t1 and to the voltage-divider tap of the first resistor r1.

The output of this first control amplifier g1 is coupled to the control input of a controlled current bank which forms a first current converter b1 via different transformation ratios. With the resistance values given above, the band-gap circuit bg provides an emitter current of 5.7 microamperes for each of the transistors t1, t2. This emitter current is the first auxiliary current i1.

The embodiment of the band-gap circuit illustrated in FIG. 1 is just an example, which, however, has the advantage of being suitable for implementation in field-effect-transistor technology. The transistor pair t1, t2 consists of substrate transistors, which can be easily realized using CMOS technology.

Another advantage of the band-gap circuit bg is that it additionally provides a temperature-stabilized band-gap voltage vr, which is applied as a reference voltage to the second current source q2. In the simplest case, the second current source q2 contains merely a second resistor r2, which is technologically equivalent to the Hall element semiconductor region, and a second control amplifier q2 which compares the voltage across the second resistor r2 with the band-gap voltage vr. The current through the second resistor r2, namely the second current i2, is readjusted by means of a second controlled current bank, the second current converter b2, until the voltage across the second resistor r2 and the band-gap voltage vr are equal. The second current source q2 thus acts as a voltage-to-current converter ui.

The temperature dependence of the first auxiliary current i1 is determined by the band-gap circuit bg as follows:

$$i1(T) = i1(To) \times (T/To)/(1 + a \times \Delta T). \quad (11)$$

Because of the temperature-stabilized band-gap voltage vr, the temperature dependence of the second auxiliary current i2 is:

$$i2(T) = i2(To)/(1 + a \times \Delta T). \quad (12)$$

If the reference voltage vr of the voltage-to-current converter ui were not temperature-independent but determined by a second temperature coefficient b, this temperature dependence would have to be incorporated as an additional factor $1 + b \times \Delta T$ into the conditional equation (12). It would then be:

$$i2(T) = i2(To) \times (1 + b \times \Delta T)/(1 + a \times \Delta T). \quad (13)$$

A defined, technology-related temperature dependence of the reference voltage vr can be implemented, for example, by deriving this voltage from the temperature dependence of one or more base-emitter paths. This can be readily implemented in a suitable, additional band-gap circuit.

To further illustrate the embodiment of FIG. 1, the following exemplary values are given. With a temperature-stabilized band-gap voltage vr of 1.2 volts and a resistor r2 of 39 kilohms, a second auxiliary current i2 of 21 microamperes is set. The temperature coefficient a of the Hall element semiconductor region, +6220 ppm, follows from the sheet resistivity r' of the n-well if CMOS technology is used. This gives temperature coefficients of $-2887$ ppm and $-6220$ ppm for the first and second auxiliary currents i1 and i2, respectively, at a reference temperature To of 333 degrees kelvin.

The embodiment of FIG. 1 is based on the assumption that the Hall voltage uh(T) is temperature-independent, which requires, according to equation (2), that the supply voltage iv(T) is also temperature-independent. This is implemented in the embodiment shown by arranging that the first and second current converters b1 and b2 deliver first and second component currents i11, i12, ... and i21, i22, ..., respectively, which have fixed transformation ratios c11, c12, ... and c21, c22, ... with respect to the first and second auxiliary ourrents i1 and i2, respectively. By summation/subtraction of the first and second component currents in adding/subtracting devices, the operating currents iv, j with the desired temperature dependences are generated, which are set via the fixed component-current ratios resulting from the weighting factors c11, ... The adding/subtracting devices are formed by nodes k1, k2, ... to which the respective component currents are supplied.

For current addition, the two component currents are supplied to the respective node directly from the two current converters b1, b2, while for subtraction, the direction of flow of one component current is reversed by means of a current mirror p before this current is fed to the associated node. During current addition, the correctly signed ppm values add up for the reference temperature, and during subtraction, that ppm value is inverted in sign prior to addition whose components current was changed in direction by means of the current mirror p.

In this manner, the temperature-independent supply current iv could be formed from two component currents, with the resultant current having to be very highly amplified via a suitable transformation ratio because the Hall elements supply current iv is, for example, 7 milliamperes. Therefore, a different approach was taken in the embodiment of FIG. 1 by generating the supply current via a control amplifier r which readjusts the supply current iv until equality exists between the voltage at the sense input 2 of the Hall element h and a reference voltage uv. The control is accomplished by means of a third control amplifier g3, whose output is coupled to the gate terminal of a p-channel transistor t3, which is connected as a current control element between the supply voltage VDD and the Hall element supply terminal 1. The reference voltage uv is formed by a third resistor r3 which is technologically equivalent to the Hall element semiconductor region and is supplied with a temperature-independent current ir1 from a first node k1. For the illustrated embodiment, ir1 is equal to 24 microamperes because i11 is equal to 45 microamperes and i21 is equal to 21 microamperes. The weighting factors c11, c21, ... are defined via the magnitudes of the respective component ourrents, i11, i21, ...

Due to the specific coupling of the two current sources q1, q2, the output current of the second current converter b2 has the temperature dependence of the offset current j(T) according to equation (7). Therefore, the offset current j is taken with the weighting factor c23 from the output of the current mirror p, whose input is supplied with the second auxiliary current i2 from the second current converter b2. In the example assumed here, the input to the current mirror is 21 microamperes, and the weighting factor c23 corresponds to a current of 0.74 microamperes. Thus, the supply current iv is approximately 10,000 times greater than the offset current j.

The embodiment of FIG. 1 shows a dotted line from the current mirror p via the second node k2, over which a constant offset current i22 with the weighting factor c22 is fed into the sense input 2 of the Hall element h if necessary, where it causes an asymmetric shift of the Hall voltage uh.

The dashed lines from the first and second current converters b1, b2 with the weighting factors c12, c24 are to indicate that at other ppm values, the offset current j can be formed from differently weighted component currents by means of the third node k3.

Finally, a dash-and-dot line indicates a further output of the first current converter b1 whose weighting factor c13 is connected to a fourth node k4, which is also supplied with the weighting factor c23 from the current mirror p. This dash-and-dot line is to indicate schematically that by optimizing the weighting factors, even non-linear effects can be taken into account in the addition/subtraction of the currents, which provides further compensation capability for higher-order effects. Besides the slope at the reference temperature To, the curves of the component currents in the entire temperature range can be taken into account, so that on an average, the compensation is improved. The weighting factors resulting from this optimization differ from the weighting factors which only take the reference temperature To into account. The conditions of equation (6) must not be violated, however.

Figure 2:
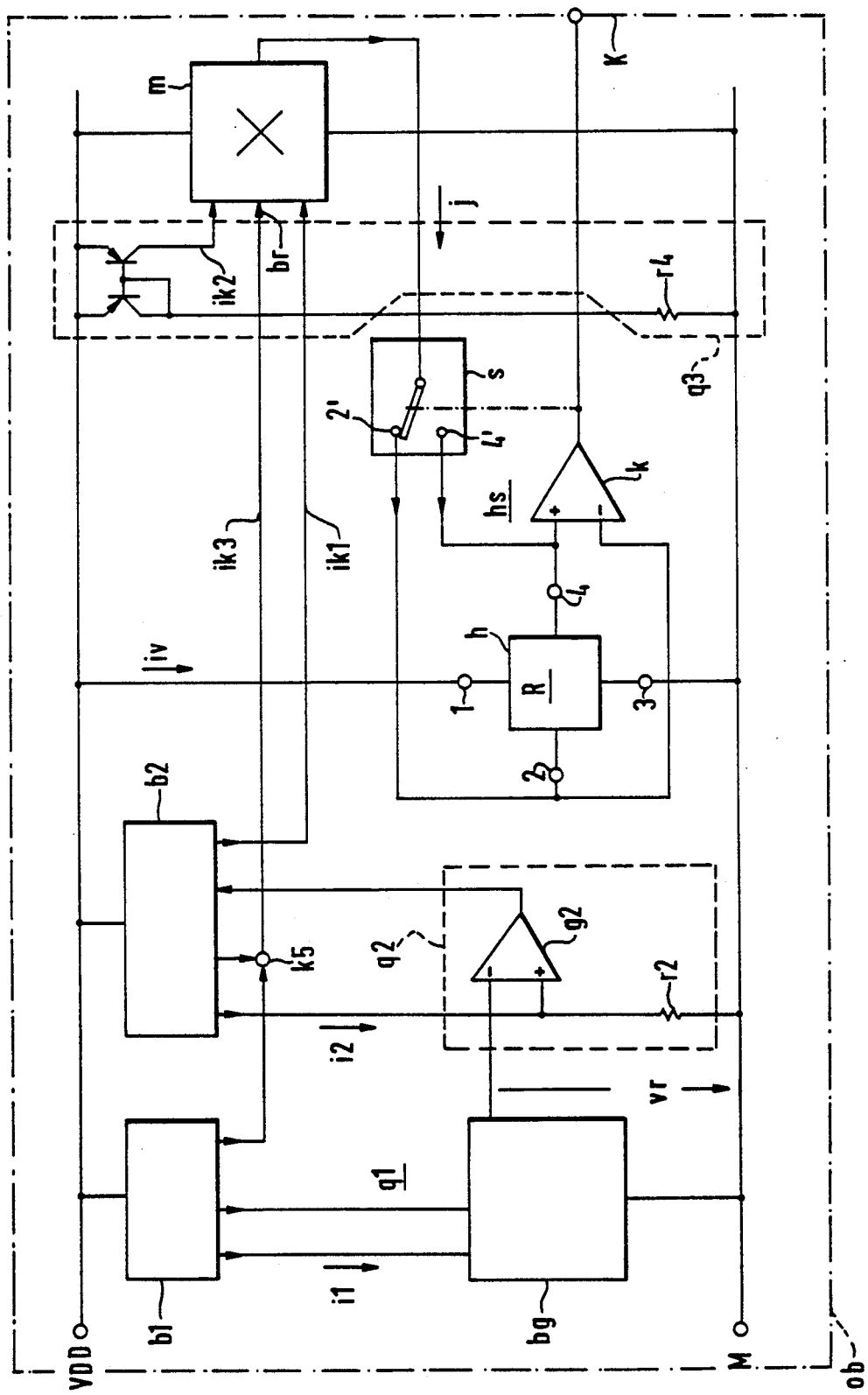
FIG. 2 is a block diagram of a second preferred embodiment in which the Hall element is supplied directly with the supply voltage VDD.
Figure 3:
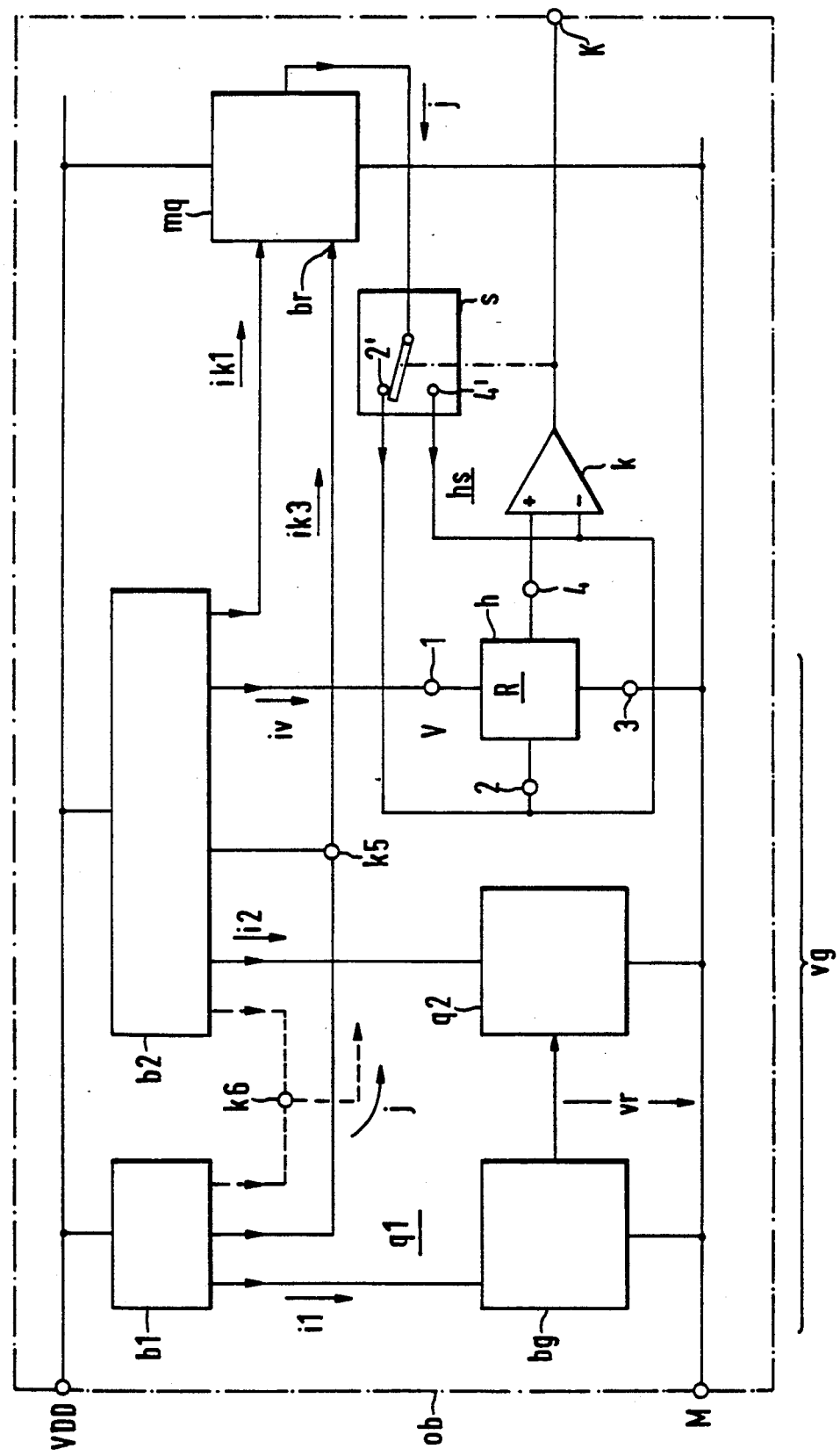
FIG. 3 is a block diagram of a third preferred embodiment using a temperature-stabilized Hall element supply voltage v.

In the embodiments of FIGS. 2 and 3, the functional units shown in the areas of the power supply device and the hysteresis switching device hs are partly identical to those of FIG. 1. Therefore, these functional units are designated by like reference characters and need not be described again. In FIG. 2, unlike in FIG. 1, the Hall element h is connected directly to the supply voltage VDD. As a result, the supply current iv is limited only by the ohmic resistance R of the Hall element h. This provides maximum magnetic-field sensitivity at a predetermined supply voltage VDD.

The conditions for the offset current j(T) follow from equation (9). What is important is that the temperature-dependent and material-dependent factor $1 + a \times \Delta T$ enters quadratically into equation (9). In the embodiment of FIG. 2, this is implemented by multiplying a first and a second current component ik1, ik2 in a multiplier m. The first current component ik1 is derived from the second auxiliary current i2, whose temperature dependence is given by equation (12). The second current component ik2 must be proportional to the supply voltage VDD and reciprocal with respect to the sheet resistivity r' of the Hall element semiconductor region. The conditional equation for the second current component ik2 is therefore:

$$ik2(T, VDD) = ik2(To) \times (VDD/VDDo/(1 + a \times \Delta T)). \quad (14)$$

The second current component ik2 is formed by means of a third current source q3, which includes a current-setting fourth resistor r4 whose semiconductor region is technologically equivalent to the semiconductor region of the Hall element h. The supply voltage vDD or a portion proportional thereto should drop across this resistor r4, so that the desired dependence is ensured. The third current source q3 shown in FIG. 3 satisfies this requirement only approximately because of the series combination of the resistor r4 and the base-emitter path of the pnp current mirror. More exact but costlier circuits are familiar to those skilled in the art for any technology. They are mostly implemented as control stages.

The output of the multiplier m delivers the offset current j with the desired temperature dependence according to equation (9).

When implementing the multiplier m, one must distinguish whether it is to be fabricated in bipolar technology or in field-effect technology, particularly in CMOS technology. In bipolar technology, use is commonly made of the exponential characteristic between the base-emitter voltage and the emitter or collector current, while in field-effect-transistor technology, the square-law relationship between the gate-source voltage and the drain current is employed. In both cases, a reference-current input br of the multiplier m must be supplied with a third current component ik3 which must be temperature-independent. The generation of this third current component ik3 by weighted addition/subtraction of the two component circuits is illustrated schematically in FIG. 2 by a fifth node k5. Such a temperature-independent current is, for example, the temperature-independent current ik1 in the embodiment of FIG. 1. A detailed explanation is therefore unnecessary.

A multiplier m in CMOS technology is described, for example, in "A Class of Analog CMOS Circuits Based on the Square-Law Characteristic of an MOS Transistor in Saturation," *IEEE Journal of Solid-State Circuits*, Vol SC-22, No. 3, June 1987, pages 357–365. A multiplier in bipolar technology is described, for example, in U. Tietze and Ch. Schenk, *Advanced Electronic Circuits*, Springer-Verlag, 1978, pages 36–37, in Chapter 1.8.2, "Multipliers with Logarithmic Function Networks." The example given therein in FIG. 1.39 shows the multiplication of two analog voltage values Ux and Uy using a reference voltage Uz. By omitting the input resistors R1, R2, R2', however, the circuit is converted for input currents in a simple manner. Furthermore, a current output must be formed from the voltage output Uo by means of a voltage-to-current converter.

The embodiment of FIG. 3 differs from the embodiment of FIG. 2 only in that the supply terminal 1 of the Hall element h is connected not to the unregulated supply voltage VDD, but to a temperature-stabilized Hall element supply voltage V. The Hall element supply voltage v is generated by a regulated voltage source vg, which may form part of the above-described power supply devices of FIG. 2 or FIG. 3, for example. The best solution is a band-gap circuit vg, which already generates a temperature-stabilized output voltage vr. This voltage only needs to be stepped up to the value of the Hall element supply voltage v by conventional circuit means, which is again done with suitable control circuits.

In the embodiment of FIG. 1, the first and second current sources q1, q2 are coupled together in such a way that the second auxiliary current i2 produces a temperature-independent voltage drop across the second resistor r2. Since the sheet resistivities of the Hall element and the second resistor r2 are technologically equivalent, a stepped-up current of the second current bank b2 produces across the ohmic resistance of the Hall element h a voltage drop which is also temperature-independent. This implementation is illustrated schematically in the embodiment of FIG. 3, where the Hall element supply terminal 1 is fed from the current converter b2.

Due to the temperature-stabilized Hall element supply voltage v, the circuit is simplified in the area of the multiplier m because the second current component ik2 is no longer necessary and only the first current component ik1 needs to be formed, which is then squared, however. The third current component ik3, which is fed to the referencecurrent input br, remains unchanged. The squaring of the first current component ik1 is done by means of a squarer mq, which is formed, for example, by the above-described multiplier m, whose two multiply inputs are then supplied with the first current component ik1.

The squaring or multiplication of the current components ik1, ik2 results in the quadratic factor $1/(-1 + a \times \Delta T)^2$ in the resultant current j. If $a \times \Delta T$ is much less than 1, the quadratic term can be replaced approximately by the factor $1/(1 + 2 \times a \times \Delta T)$. However, a current with this temperature dependence can be generated by weighted addition/subtraction of two component currents as shown in the embodiment of FIG. 1, which eliminates the need for the relatively complicated multiplication or squaring of currents. This alternative is indicated in FIG. 3 by the sixth node k6 and the dashed-line current connections to the first and second current converters b1, b2. The output of the sixth node k6 then delivers the desired offset current j.

What is claimed is:

1. A compensated Hall sensor implemented in a monolithic integrated circuit hearing a Hall element therein, said Hall sensor comprising:

an integrated power supply that generates operating currents for said Hall sensor, said power supply comprising:
a first current source that provides a first auxiliary current with a first temperature dependence and a second current source that generates a second auxiliary current with a second temperature dependence;
a first resistor in said first current source and a second resistor in said second current source, said first and second resistors being formed in semiconductor regions technologically equivalent to the semiconductor region of the Hall element;
a first current converter that delivers first component currents and a second current converter that delivers second component currents, said first and second components currents having predetermined transformation ratios with respect to the first and second auxiliary currents, respectively; and
adding/subtracting devices that generate said operating currents by summation/subtraction of the first and second component currents.

2. The Hall sensor as defined in claim 1, further comprising an element that senses the Hall voltage, said element being integrated on said monolithic integrated circuit.

3. The Hall sensor as defined in claim 2, wherein said operating currents include a supply current and an offset current.

4. The Hall sensor as claimed in claim 3, wherein:
said sensing element comprises a comparator having two states; and
said superposing device comprises a hysteresis switching device having two switch positions, said hysteresis switching device determining the direction of a hysteresis voltage via said switch positions, said hysteresis switching device having a control input connected to the output of said comparator.

5. The Hall sensor as defined in claim 2, further including a superposing device that superposes an offset voltage on the Hall voltage via an offset current.

6. The Hall sensor as defined in claim 5, wherein the superposition takes place directly at the Hall element.

7. The Hall sensor as defined in claim 5, further including at least one auxiliary resistor which is technologically equivalent to the semiconductor region of the Hall element, the superposition of said offset voltage being decoupled from the Hall element as the offset current is fed into said at least one auxiliary resistor.

8. The Hall sensor as defined in claim 5, wherein the temperature dependence of the offset current is set via the component-current ratio and is related to the temperature dependence of a supply current as follows:

$$\Delta iv(T)/\Delta j(T) = 1 + a \times \Delta T,$$

where
a = a first temperature coefficient of the sheet resistivity of the Hall element semiconductor region;
T = absolute temperature;
To = reference temperature; and
ΔT = T − To = reference-temperature difference.

9. The Hall sensor as defined in claim 8, wherein:
said first current source includes a band-gap circuit having a transistor pair having an emitter-area ratio A, said first current source utilizing said first resistor to generate said first auxiliary current with the following temperature dependence:

$$i1(T) = i1(To) \times (T/To)/(1 + a \times \Delta T);$$

said first resistor has a voltage across it having a first temperature dependence;
said second resistor of said second current source has a voltage across it having a temperature dependence different from the temperature dependence of the voltage across the first resistor, said voltage having a second temperature coefficient b;
said voltage across said second auxiliary current has a temperature dependence defined by said second coefficient b and by said first coefficient a as follows:

$$i2(T) = i2(To) \times (1 + b \times \Delta T)/(1 + a \times \Delta T);$$

and
said first and second current converters comprise a first controlled current bank, and a second control current bank, respectively, having respective outputs that deliver said component currents with said predetermined transformation ratios.

10. The Hall sensor as defined in claim 9, wherein said voltage across said second resistor is a temperature-stabilized voltage generated by said band-gap circuit.

11. A method of automatically compensating a Hall sensor for the production-induced sensitivity and temperature dependence of the Hall element formed on a semiconductor region of a chip surface, said semiconductor region having a sheet resistivity, said method comprising the steps of:
forming operating currents required for the Hall element that are thermally and technologically tightly coupled with the Hall element by means of a power supply device which is integrated together with the Hall element on said chip surface;
generating a first auxiliary current with a first temperature dependence and a second auxiliary current with a second temperature dependence different from said first temperature dependence, the magnitudes and temperature dependences of the first and second auxiliary currents being determined by said sheet resistivity, r′, as a common temperature-dependent and technology-dependent factor r′ × (1 + a × ΔT), where a is first temperature coefficient; and
proportionately adding or subtracting said first and second auxiliary currents by means of adding/subtracting devices to form said operating currents for said Hall element, the temperature dependences of said operating currents being determined by the magnitudes of the respective auxiliary-current.

12. The method as defined in claim 11, wherein said power supply device includes current-setting resistors which are technologically equivalent to the Hall element semiconductor region.

13. The method as defined in claim 12, wherein said operating currents for said Hall element are formed by a supply current (iv) and an offset current j having temperature dependences (iv(T), j(t)) related as follows:

$$\Delta iv(T)/\Delta j(T) = 1 + a \times \Delta T.$$

14. The method as defined in claim 11, wherein:

said first auxiliary current is generated by means of a band-gap circuit, the magnitude of the first auxiliary current being determined by a first resistor which is technologically equivalent to the Hall element semiconductor region, and a transistor pair with an emitter-area ratio A; and said second auxiliary current is formed by means of a second resistor which is technologically equivalent to the Hall element semiconductor region and across which a voltage is developed whose temperature dependence is different from the temperature dependence of the voltage across the first resistor.

15. The method as defined in claim 14, wherein the voltage across the second resistor is a temperature-stabilized voltage from the band-gap circuit.

16. The method as defined in claim 13, wherein:

the supply current is adjusted so that its temperature dependence in the operating range becomes zero; and the offset current is adjusted so that its temperature dependence in the operating range is determined by the equation:

$$j(T) = j(To) \times 1/(1 + a \times \Delta T).$$

17. The method as defined in claim 11, further including the step of automatically compensating the nonlinear portions of the temperature dependences to reduce said temperature dependences by taking into account the nonlinear temperature coefficients in addition to the linear ones in the proportionate addition or subtraction of the first and second auxiliary currents by a proportionate additional addition or subtraction of the first and second auxiliary currents, the respective portions of the first and second auxiliary currents being determined by additional preset transformation ratios.

18. A method of automatically compensating a Hall sensor comprising a hysteresis switching device for the production-induced and temperature-induced hysteresis switching sensitivity of the Hall element comprising the steps of:

determining a supply current required for the Hall element by the Hall-element resistance and a supply voltage applied thereto;

forming an offset current required for the Hall element that is thermally and technologically tightly coupled with the Hall element using a power supply device which is integrated together with the Hall element on a chip surface, said offset current being formed from a first current component and a second current component using a multiplier having a reference input that receives a third current component (ik3) whose temperature dependence at a reference temperature (To) is zero;

forming said first current component using a first current source and a second current source designed to interact so that the first current component has the following dependences:

$$ik1(T) = ik1(To) \times 1/(1 + a \times \Delta T),$$

where
a = temperature coefficient (=first coefficient) of the Hall element semiconductor region;
T = absolute temperature;
To = reference temperature;
$\Delta T = T - To$ = reference-temperature difference;

forming said second current component using a third current source designed so that the effect of the supply voltage with its absolute value and its temperature dependence is as follows:

$$ik2(T, VDD) = ik2(To) \times (VDD(VDDo)/(1 + a \times \Delta);$$

and forming the third current component at a fifth node by proportionate addition or subtraction of a first auxiliary current from the first current source and a second auxiliary current from the second current source, said second auxiliary current having another temperature dependence, the respective current portions being fixed so that the resultant third current component exhibits no temperature dependence at the reference temperature.

19. The method as defined in claim 18, wherein:

the unregulated supply voltage for the Hall element is replaced by a voltage-stabilized and temperature-stabilized Hall element supply voltage from a regulated voltage source;

the multiplier is replaced by a squarer, the first current component being squared and the third current component being fed to the reference-current input of the squarer.

20. The method as defined in claim 18, wherein the quadratic temperature-dependent factor $(1/(1 + a \times \Delta T)^2)$ of the offset current is replaced by a proportionate addition or subtraction of the first and second auxiliary currents using a sixth node, whereby a resultant offset current is formed having a temperature dependence at the reference temperature To determined approximately by the factor $1/(1 + 2 \times a \times \Delta T)$.

* * * * *